US006822514B1

(12) United States Patent
Aude

(10) Patent No.: US 6,822,514 B1
(45) Date of Patent: Nov. 23, 2004

(54) AMPLIFIER WITH MILLER-EFFECT COMPENSATION FOR USE IN CLOSED LOOP SYSTEM SUCH AS LOW DROPOUT VOLTAGE REGULATOR

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 206 days.

(21) Appl. No.: 10/244,501

(22) Filed: Sep. 16, 2002

(51) Int. Cl.[7] ............................. H03F 3/45; H03F 1/14
(52) U.S. Cl. ...................................... 330/260; 330/292
(58) Field of Search ................................ 330/252, 253, 330/260, 292, 294, 257

(56) References Cited

U.S. PATENT DOCUMENTS 6,566,952 B1 * 5/2003 Allan .......................... 330/255
6,580,325 B1 * 6/2003 Aude .......................... 330/260

* cited by examiner

Primary Examiner—Steven J. Mottola
(74) Attorney, Agent, or Firm—Vedder Price Kaufman & Kammholz, P.C.

(57) ABSTRACT

Circuitry including Miller-effect feedback for use as part of a closed loop system such as a low dropout voltage regulator that provides current to a load at a specified voltage close in value to the power supply voltage. Various aspects of the presently claimed invention include using, within the Miller-effect feedback loop: a buffer amplifier to reduce loading effects upon an internal high impedance circuit node, output compensation circuitry to introduce a transfer function pole for substantially canceling a transfer function zero associated with external load circuitry; and Miller-effect compensation circuitry to introduce a transfer function zero for substantially canceling a transfer function pole associated with the Miller-effect feedback.

20 Claims, 15 Drawing Sheets

US 6,822,514 B1

AMPLIFIER WITH MILLER-EFFECT COMPENSATION FOR USE IN CLOSED LOOP SYSTEM SUCH AS LOW DROPOUT VOLTAGE REGULATOR

BACKGROUND OF THE INVENTION

1. Field of the Invention

The present invention relates to amplifiers for use as part of a closed loop system such as low dropout voltage regulators, and in particular, to amplifiers for use in such systems using Miller-effect feedback.

2. Description of the Related Art

Closed loop systems, by definition, use various forms of feedback, generally for purposes of stabilization of circuit operation. One example of such a closed loop system is a low dropout voltage regulator (LDO). (The following discussion will be within the context of an LDO, but it should be understood that the principles and advantages of the present invention can be realized and implemented in other forms of closed loop systems as well.) As is well known in the art, an LDO is a closed loop system that provides current to a load at a specific voltage, with such load voltage typically being very close in value to the overall system power supply voltage. Typically such an LDO is a self-contained system that is placed onto a printed circuit board as part of a larger host system, with the LDO generally being a mixture of on-chip and off-chip components.

Referring to FIG. 1, for example, the components providing an LDO function will frequently include an integrated circuit, as noted above, mounted on a printed circuit board within a host system (not shown). The integrated circuit will include the on-chip error amplifier TCA (e.g., a transconductance amplifier), along with its reference voltage source and an internal load. External to the integrated circuit and also resident on the printed circuit board, will be a power transistor Q1 (typically a PNP bipolar junction transistor) and an external filter capacitor. The power transistor Q1 serves as the regulating circuit element between the main power supply VDD and the regulated power supply voltage source Vreg. The filter capacitor external filters the regulated voltage Vreg, shunting any spurious or noise components to the negative power supply rail VSS (or ground GND). The error amplifier TCA must be able to drive the base terminal of the power transistor Q1 such that the transistor Q1 is fully on. Accordingly, this puts some restrictions on the design of the output stage of the error amplifier TCA.

Referring to FIGS. 2A and 2B, a typical output stage for the error amplifier TCA is a P-type metal oxide semiconductor field effect transistor (PMOSFET) M11. The gate terminal of transistor M11 is driven by an input voltage Vin and, in turn, the source terminal of transistor M11 provides the base voltage VB for the base terminal of the power transistor Q1. Further in turn, the power transistor Q1 provides the current for the load Rload across which the regulated output voltage Vreg appears and is filtered by the external filter capacitance which includes a capacitive component Cload and an effective series resistance Resr (discussed in more detail below).

This circuit arrangement is chosen to provide good control of the DC gain from input voltage Vin to intermediate voltage VB, as well as good control over the transfer function pole associated with the base terminal of transistor Q1. As indicated in the circuit model of FIG. 2B, there are two poles and two zeros in the transfer function for this system. The first pole P1 and zero Z1 are associated with the output node where the output voltage Vreg appears, while the second pole P2 and zero Z2 are associated with the base terminal of transistor Q1.

Pole 1 P1 is a function of the load capacitance Cload and load resistance Rload. With the load capacitance Cload fixed, this pole P1 becomes a linear function of the load resistance Rload. Pole 2 is a function of the input capacitance Cpi and resistance Rpi (as components of the input impedance of the transistor Q1 (in parallel with the output impedance gm*Vgs of source follower transistor M11). In accordance with well known transistor principles, this transistor input resistance Rpi and capacitance Cpi are, at least to a first order approximation, linearly dependent on the collector current IC of transistor Q1, while the transconductance gm of the PMOS transistor M11 is square law dependent on the collector current IC (due to its relationship to its base current IB of transistor Q1, which is equal to the drain current ID of transistor M11). If transistor M11 is scaled such that the input resistance Rpi of transistor Q1 is much lower than the inverse of the transconductance of transistor M11, then pole P2 will stay relatively constant over a broad range of load resistance Rload. Further, as a practical matter, the size of transistor M11 often cannot be so large that it stays in saturation over the entire range of load resistance Rload. Therefore, at load currents below the saturation level, transistor M11 will behave resistively, thereby keeping the pole P2 relatively stable.

The voltage gain from the input Vin at the gate terminal of transistor M11 to the base voltage VB at the base terminal of transistor Q1 will increase as a function of the transistor Q1 collector current IC raised to a power of 1.5 when the load current is reduced until transistor M11 transitions into its linear region of operation, where it will then increase linearly to a maximum of unity. Since the output voltage Vreg will be fixed, the output or load current necessarily has a linear relationship with the load resistance Rload. Accordingly, the voltage gain from the base voltage Vb to the collector, or output, voltage Vreg should remain constant. As a practical matter, however, the emitter resistance of transistor Q1, albeit small, will cause the transconductance of transistor Q1 to degenerate for large collector current IC.

The second zero Z2 is associated with the feed forward path provided by parasitic capacitance CMU of transistor Q1. For low load impedances, this zero Z2 goes to a very high frequency. The first zero Z1 is associated with the effective series resistance (RESR) of the load capacitor Cload. This resistance will remain substantially constant. The load resistance Rload is normally assumed to be nominally resistive. With a large load capacitance Cload and low load resistance Rload, the output node produces a high frequency pole. However, under high load resistance Rload, this output node pole becomes significantly lower. Accordingly, the circuit cannot be compensated at the output node because a low frequency dominant pole does not always exist. Similarly, to cover the entire range of possible load resistance values, a very large capacitance Cload would be required to compensate the high impedance node within the error amplifier. Such a large capacitance would require a very large current to slew. However, to produce a high DC gain, the output current must remain low. These two requirements conflict with each other, plus the required capacitor would be too large for a practical design.

A more practical solution has been to use Miller feedback, i.e., a feedback capacitance Cm between the load terminal and internal terminal of the error amplifier. However, it has been shown that traditional Miller feedback can severely degrade the power supply rejection ratio (PSRR) of the circuit. On the other hand, it has also been shown that connecting the Miller feedback capacitance back to a low impedance node of the amplifier rather than connecting it to a high impedance node can provide the same Miller capacitance gain while significantly improving the PSRR.

Referring to FIG. 3, one example of an LDO uses a complementary MOSFET (CMOSFET) folded cascode amplifier stage (P-MOSFETs M1, M2, M7, M8, M9, M10 and M12, and N-MOSFETs M3, M4, M5 and M6) to provide high DC gain, a wide output voltage swing close to the positive power supply rail VDD, and to allow a low input reference voltage Vref of 1.2 volts (e.g., provided by a bandgap voltage source). This cascode stage drives the output transistor M11 of the error amplifier, which in turn, drives the external power transistor Q1, as discussed above. The Miller feedback capacitance couples the output terminal at the collector of the power transistor Q1 to a low impedance node of the error amplifier at the source terminal of cascode transistor M6. Transistors M3 and M4 are biased by a fixed bias voltage Vbn1, transistors M5 and M6 are biased by another fixed bias voltage Vbn2, and transistors M9, M10 and M12 are biased by still another fixed bias voltage Vbp1. The gate of transistor M1 receives the sense voltage which is tapped off of a resistive voltage divider Rtop, Rbottom at the output, while the gate terminal of transistor M2 receives the reference voltage from the reference voltage source (FIG. 1).

Referring to FIG. 4, this system includes two closed loops: the Miller loop and the DC loop. The Miller loop begins at the top of the load resistor Rload, follows through the Miller feedback capacitance CM, through the channel (from source to drain terminals) of transistor M6 into the gate and out the source terminals of transistor M11, and into the base and out the collector terminals of transistor Q1 back to the top of the load resistor Rload. The DC loop begins at the sense voltage terminal and passes through transistors M1 and M2 to the source terminal of transistor M6 and into the Miller loop which ultimately conveys the signal back to the sense terminal.

Referring to FIG. 5, the DC loop terminates into the Miller loop at the source terminal at transistor M6, as noted above, and can be modeled as an ideal transconductor as depicted. This transconductor gm*(Vreg−Vref) pushes current into the Miller loop at the source terminal of transistor M6. The resultant voltage appearing at the collector terminal of transistor Q1 is divided down by the voltage divider Rtop, Rbottom to generate the feedback sense voltage Vsense. Since the transconductor output current develops a voltage across impedance in the Miller loop, the magnitude and phase of that impedance will determine the gain and phase of the DC loop.

Referring to FIG. 6, in a somewhat simplified view of the Miller loop, five transfer function poles and four transfer function zeros can be identified. Poles 1 and 2 and zeros 1 and 2 are as discussed above in connection with FIG. 2B. Zero 3 need not be considered for the purposes of this discussion, while zero 4 is at DC. Pole 5 is at a very high frequency because of the low impedance associated with the source terminal of transistor M10. Pole 3 is at a low frequency and is a function of a ratio of the Miller feedback capacitance CM, the parasitic capacitance associated with the junction of the gate terminal of transistor M11 and drain terminals of transistors M6 and M10, and the high impedance of such junction as reflected back to the source terminal of transistor M6. Pole 4 is at a frequency defined by a ratio of the transconductants of transistor M6 to the capacitance associated with the drain terminal of transistor M6.

SUMMARY OF THE INVENTION

In accordance with the presently claimed invention, circuitry includes Miller-effect feedback for use as part of a closed loop system such as a low dropout voltage regulator that provides current to a load at a specified voltage close in value to the power supply voltage. Various aspects of the presently claimed invention include using, within the Miller-effect feedback loop: a buffer amplifier to reduce loading effects upon an internal high impedance circuit node, output compensation circuitry to introduce a transfer function pole for substantially canceling a transfer function zero associated with external load circuitry; and Miller-effect compensation circuitry to introduce a transfer function zero for substantially canceling a transfer function pole associated with the Miller-effect feedback.

In accordance with one embodiment of the presently claimed invention, an integrated circuit with a buffer amplifier inside a Miller-effect feedback loop for reducing loading on an internal high impedance circuit terminal includes first amplification circuitry, buffer amplification circuitry and second amplification circuitry. The first amplification circuitry includes an internal terminal and a first amplifier output terminal, wherein: the internal terminal has an internal terminal impedance associated therewith; the first amplifier output terminal has a first amplifier output terminal impedance associated therewith; the internal terminal impedance is substantially lower than the first amplifier output terminal impedance; and the first amplification circuitry is adapted to couple via the internal terminal to a Miller-effect feedback capacitance. The buffer amplification circuitry includes buffer input and output terminals, wherein the buffer input terminal is coupled to the first amplifier output terminal. The second amplification circuitry includes a second amplifier input terminal coupled to the buffer output terminal, wherein: the second amplifier input terminal has a second amplifier input terminal impedance associated therewith; the second amplifier input terminal impedance is substantially lower than the first amplifier output terminal impedance; and the second amplification circuitry is adapted to couple to further amplification circuitry that includes the Miller-effect feedback capacitance.

In accordance with another embodiment of the presently claimed invention, an integrated circuit with a buffer amplifier inside a Miller-effect feedback loop for reducing loading on an internal high impedance circuit node includes first amplifier means, buffer amplifier means and second amplifier means. The first amplifier means is for receiving via an internal node a feedback signal via a Miller-effect feedback capacitance and providing via a first amplifier output node a first amplified signal, wherein: the internal node has an internal node impedance associated therewith; the first amplifier output node has a first amplifier output node impedance associated therewith; and the internal node impedance is substantially lower than the first amplifier output node impedance. The buffer amplifier means is for receiving and buffering the first amplified signal and providing a buffered signal. The second amplifier means is for receiving via a second amplifier input node and amplifying the buffered signal and providing a second amplified signal for further amplifier means including the Miller-effect feedback capacitance, wherein: the second amplifier input node has a second amplifier input node impedance associated therewith; and the second amplifier input node impedance is substantially lower than the first amplifier output node impedance.

In accordance with still another embodiment of the presently claimed invention, an integrated circuit with a compensation circuit inside a Miller-effect feedback loop includes first amplification circuitry, second amplification circuitry and compensation circuitry. The first amplification circuitry includes an internal terminal and a first amplifier output terminal, wherein: the first amplifier output terminal has a first amplifier output terminal impedance associated therewith; and the first amplification circuitry is adapted to couple via the internal terminal to a Miller-effect feedback capacitance. The second amplification circuitry includes a second amplifier input terminal having a second amplifier input terminal impedance associated therewith, wherein: the second amplifier input terminal impedance is substantially lower than the first amplifier output terminal impedance; and the second amplification circuitry is adapted to couple to further amplification circuitry that includes the Miller-effect feedback capacitance and a shunt capacitance having an effective series resistance associated therewith. The compensation circuitry is coupled between the first amplification circuitry and the second amplification circuitry. The first amplification circuitry, the compensation circuitry and the second amplification circuitry together, when coupled to the further amplification circuitry, have a circuit transfer function associated therewith that includes: a transfer function zero associated with at least a portion of the further amplification circuitry; and a transfer function pole associated with the compensation circuitry. The transfer function zero and pole are at substantially equal frequencies.

In accordance with still another embodiment of the presently claimed invention, an integrated circuit with a compensation circuit inside a Miller-effect feedback loop includes first amplifier means, compensation means and second amplifier means. The first amplifier means is for receiving via an internal node a feedback signal via a Miller-effect feedback capacitance and providing via a first amplifier output node a first amplified signal, wherein the first amplifier output node has a first amplifier output node impedance associated therewith. The compensation means is for compensating the first amplified signal and providing a compensated signal. The second amplifier means is for receiving via a second amplifier input node and amplifying the compensated signal and providing a second amplified signal for further amplifier means including the Miller-effect feedback capacitance and a shunt capacitance having an effective series resistance associated therewith, wherein: the second amplifier input node has a second amplifier input node impedance associated therewith; and the second amplifier input node impedance is substantially lower than the first amplifier output node impedance. The first amplifier means, the compensation means and the second amplifier means together, when coupled to the further amplifier means, have a transfer function associated therewith that includes: a transfer function zero associated with at least a portion of the further amplifier means; and a transfer function pole associated with the compensation means. The transfer function zero and pole are at substantially equal frequencies.

In accordance with yet another embodiment of the presently claimed invention, an integrated circuit with a plurality of compensation circuits inside a Miller-effect feedback loop includes input amplification circuitry, buffer amplification circuitry, Miller-effect compensation circuitry, output amplification circuitry and output compensation circuitry. The input amplification circuitry includes an internal terminal and an input amplifier output terminal, wherein: the input amplifier output terminal has an input amplifier output terminal impedance associated therewith; and the input amplification circuitry is adapted to couple via the internal terminal to a Miller-effect feedback capacitance. The buffer amplification circuitry includes a buffer input terminal coupled to the input amplifier output terminal. The Miller-effect compensation circuitry is coupled between the input amplification circuitry and the buffer amplification circuitry. The output amplification circuitry includes an output amplifier input terminal and is adapted to couple to further amplification circuitry that includes the Miller-effect feedback capacitance and a shunt capacitance having an effective series resistance associated therewith. The output compensation circuitry is coupled between the buffer and output amplification circuitry. The input amplification circuitry, the Miller-effect compensation circuitry, the buffer amplification circuitry, the output compensation circuitry, and the output amplification circuitry together, when coupled to the further amplification circuitry, have a circuit transfer function associated therewith that includes: a first transfer function zero associated with the Miller-effect compensation circuitry; a second transfer function zero associated with at least a portion of the further amplification circuitry; a first transfer function pole associated with the Miller-effect feedback capacitance; and a second transfer function pole associated with the output compensation circuitry. The first transfer function zero and pole are at first substantially equal frequencies, and the second transfer function zero and pole are at second substantially equal frequencies.

In accordance with yet another embodiment of the presently claimed invention, an integrated circuit with a plurality of compensation circuits inside a Miller-effect feedback loop includes input amplifier means, Miller-effect compensation means, buffer amplifier means, output compensation means and output amplifier means. The input amplifier means is for receiving via an internal node a feedback signal via a Miller-effect feedback capacitance and providing via an input amplifier output node a first amplified signal, wherein the input amplifier output node has an input amplifier output node impedance associated therewith. The Miller-effect compensation means is for compensating the first amplified signal and providing a first compensated signal. The buffer amplifier means is for receiving and buffering the first compensated signal and providing a buffered signal. The output compensation means is for compensating the buffered signal and providing a second compensated signal. The output amplifier means is for receiving via an output amplifier input node and amplifying the second compensated signal and providing a second amplified signal for further amplifier means including the Miller-effect feedback capacitance and a shunt capacitance having an effective series resistance associated therewith. The input amplifier means, the Miller-effect compensation means, the buffer amplifier means, the output compensation means and the output amplifier means together, when coupled to the further amplifier means, have a transfer function associated therewith that includes: a first transfer function zero associated with the Miller-effect compensation means; a second transfer function zero associated with at least a portion of the further amplifier means; a first transfer function pole associated with the Miller-effect feedback capacitance; and a second transfer function pole associated with the output compensation means. The first transfer function zero and pole are at first substantially equal frequencies, and the second transfer function zero and pole are at second substantially equal frequencies.

BRIEF DESCRIPTIONS OF THE DRAWINGS

DETAIL DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators.

Figure 1:
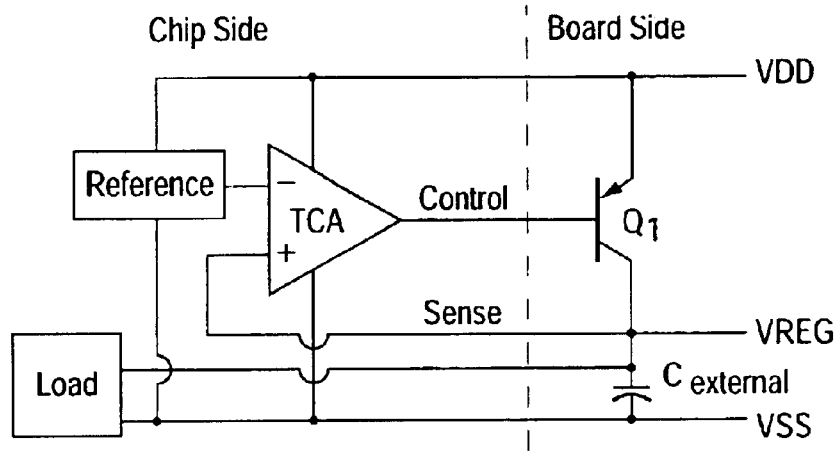
FIG. 1 is a schematic diagram of a PNP type low dropout voltage regulator for driving an on-chip load.
Figure 2A:
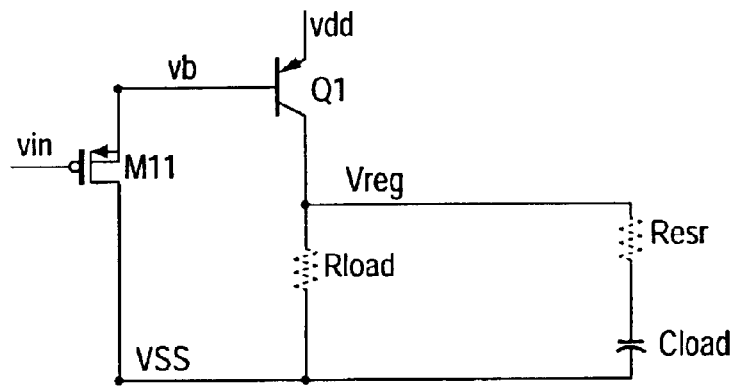
FIG. 2A is a schematic diagram of the output and load circuitry for the circuit in FIG. 1.
Figure 2B:
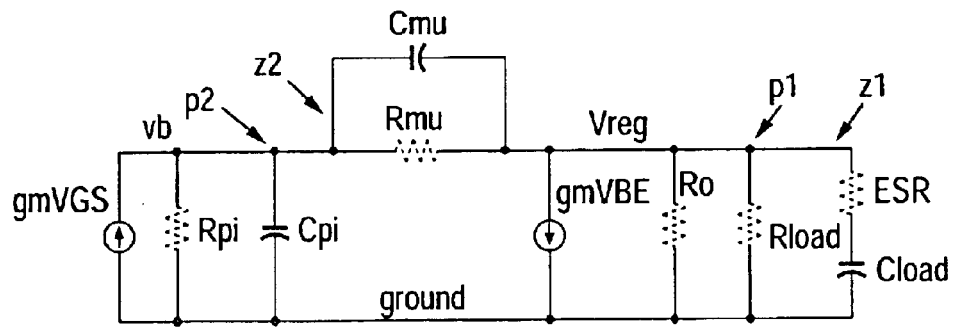
FIG. 2B is a schematic diagram of the circuit model for the circuit of FIG. 2A.
Figure 3:
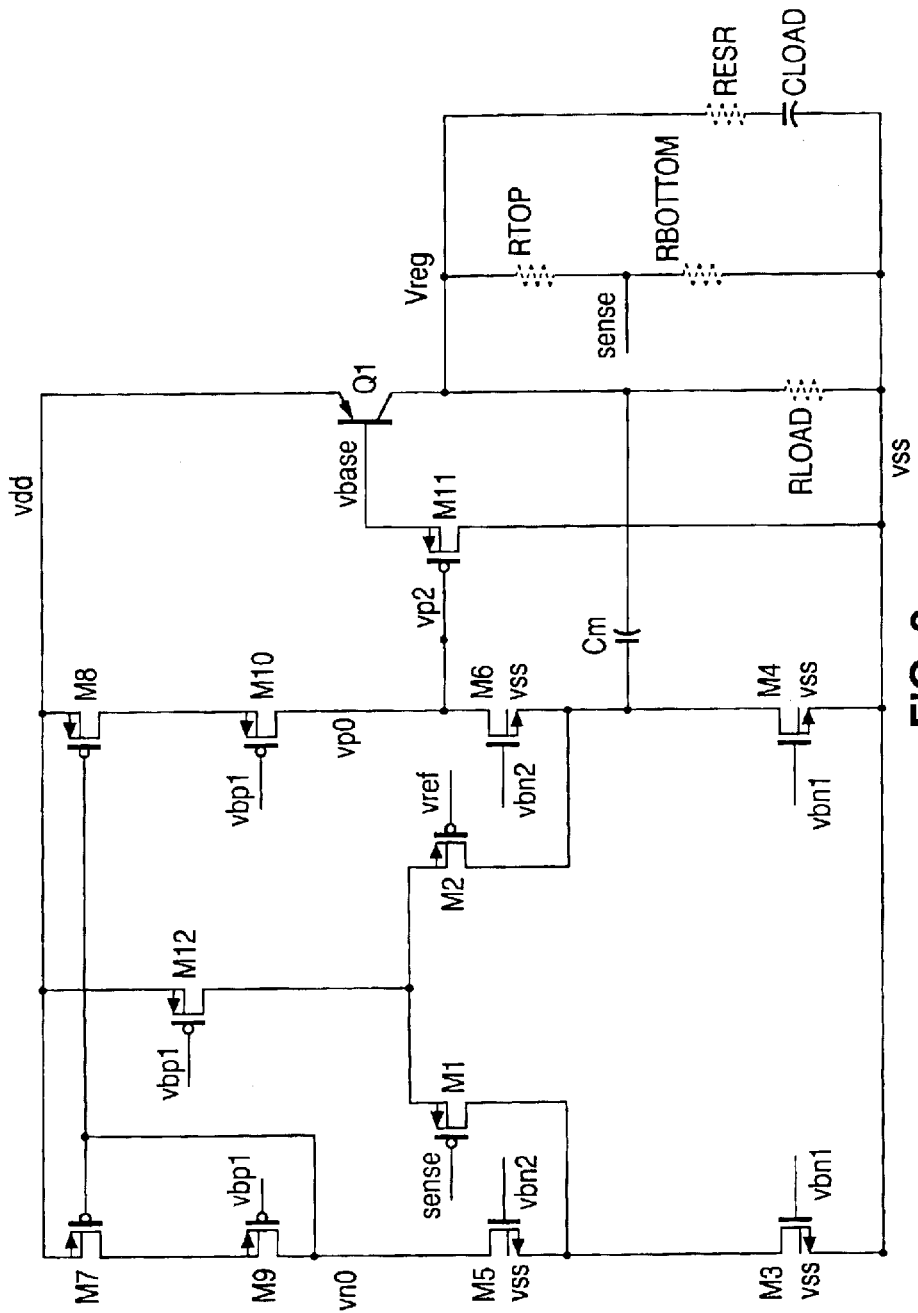
FIG. 3 is a schematic diagram of a conventional low dropout voltage regulator circuit.
Figure 4:
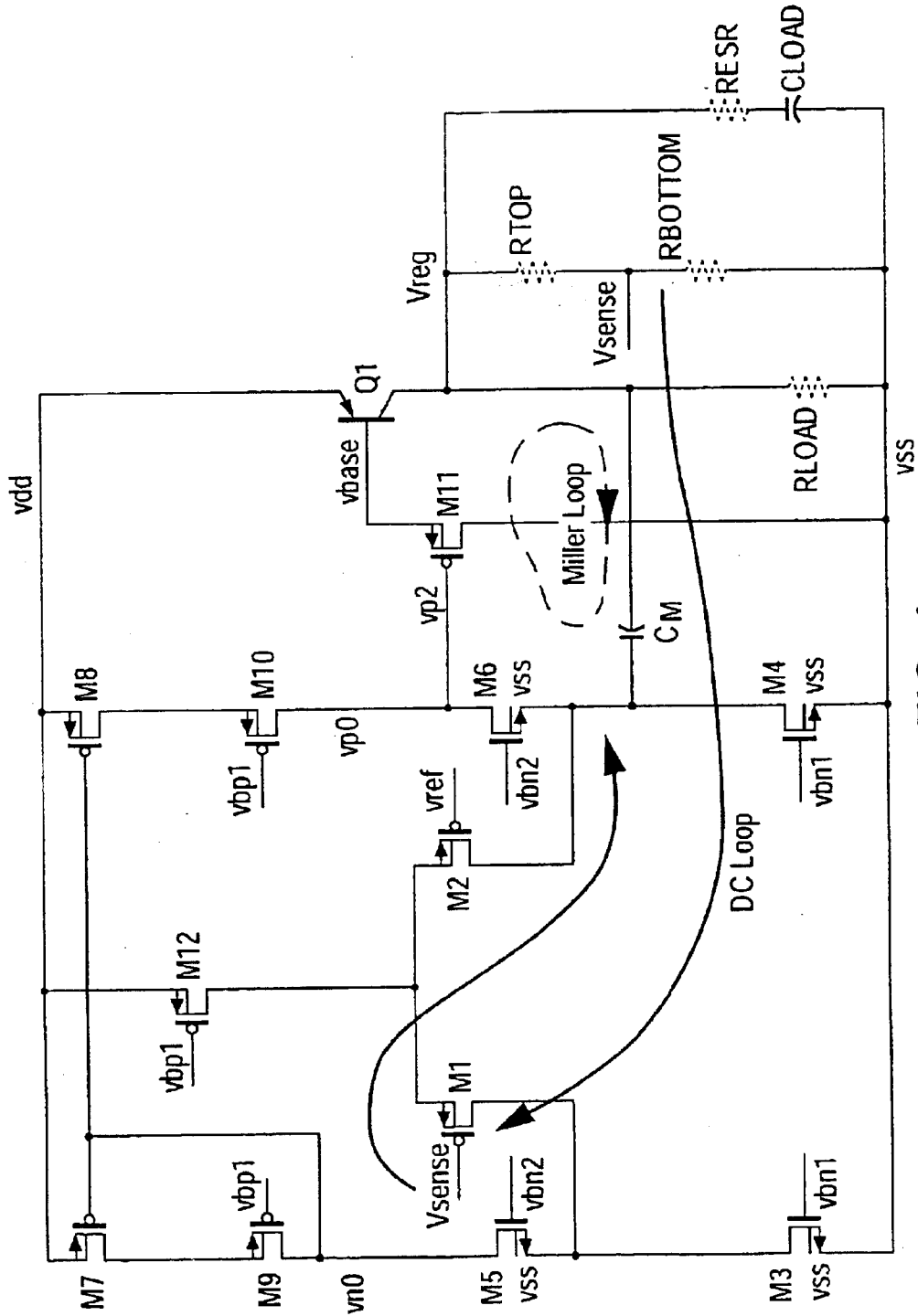
FIG. 4 is a schematic diagram illustrating the Miller and DC loops of the circuit of FIG. 3.
Figure 5:
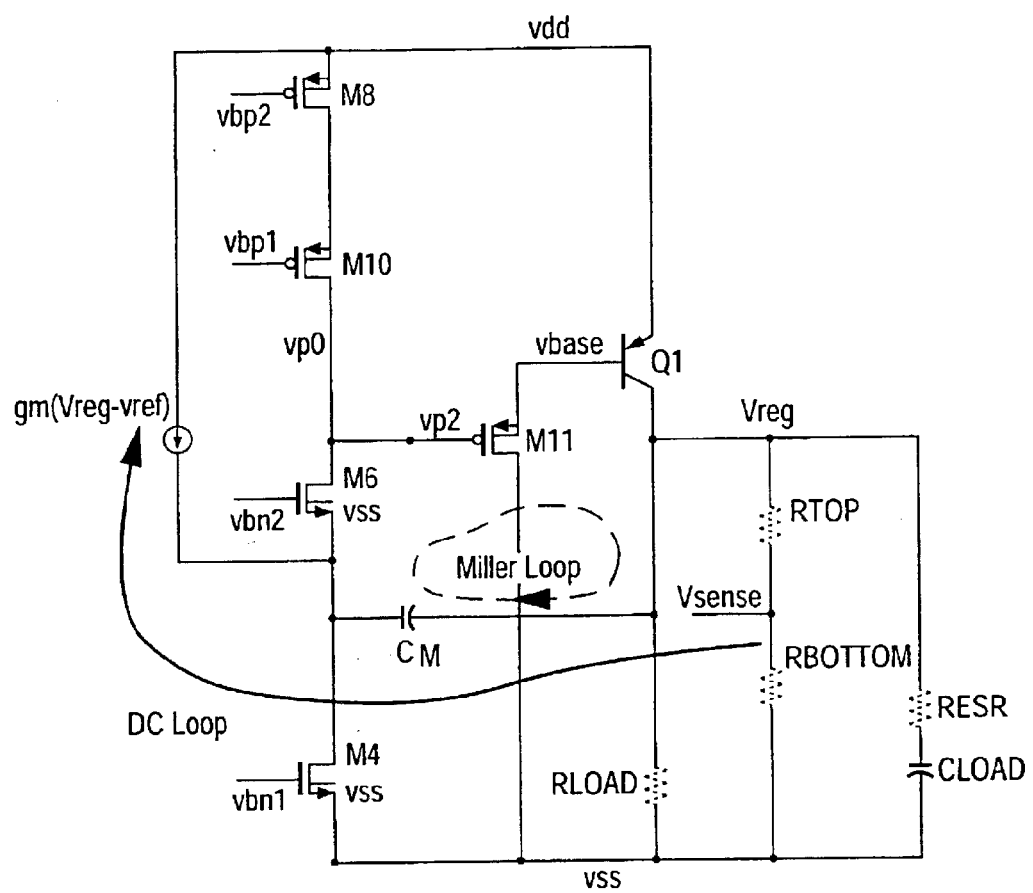
FIG. 5 is an schematic diagram of the circuit of FIG. 3 with a simplified model for the DC loop.
Figure 6:
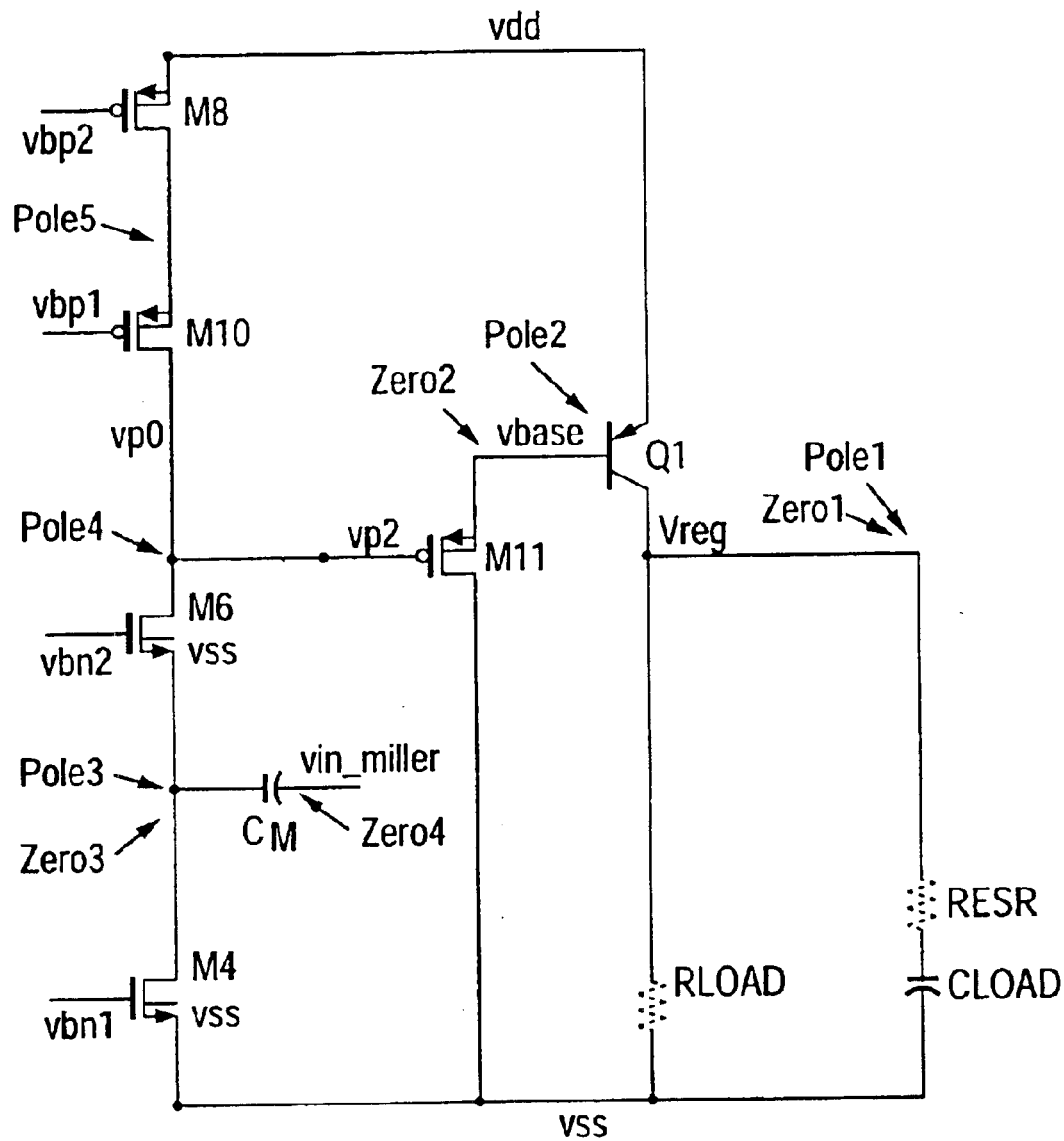
FIG. 6 is a partial schematic diagram of the circuit of FIG. 3 with the transfer function poles and zeros identified.
Figure 7:
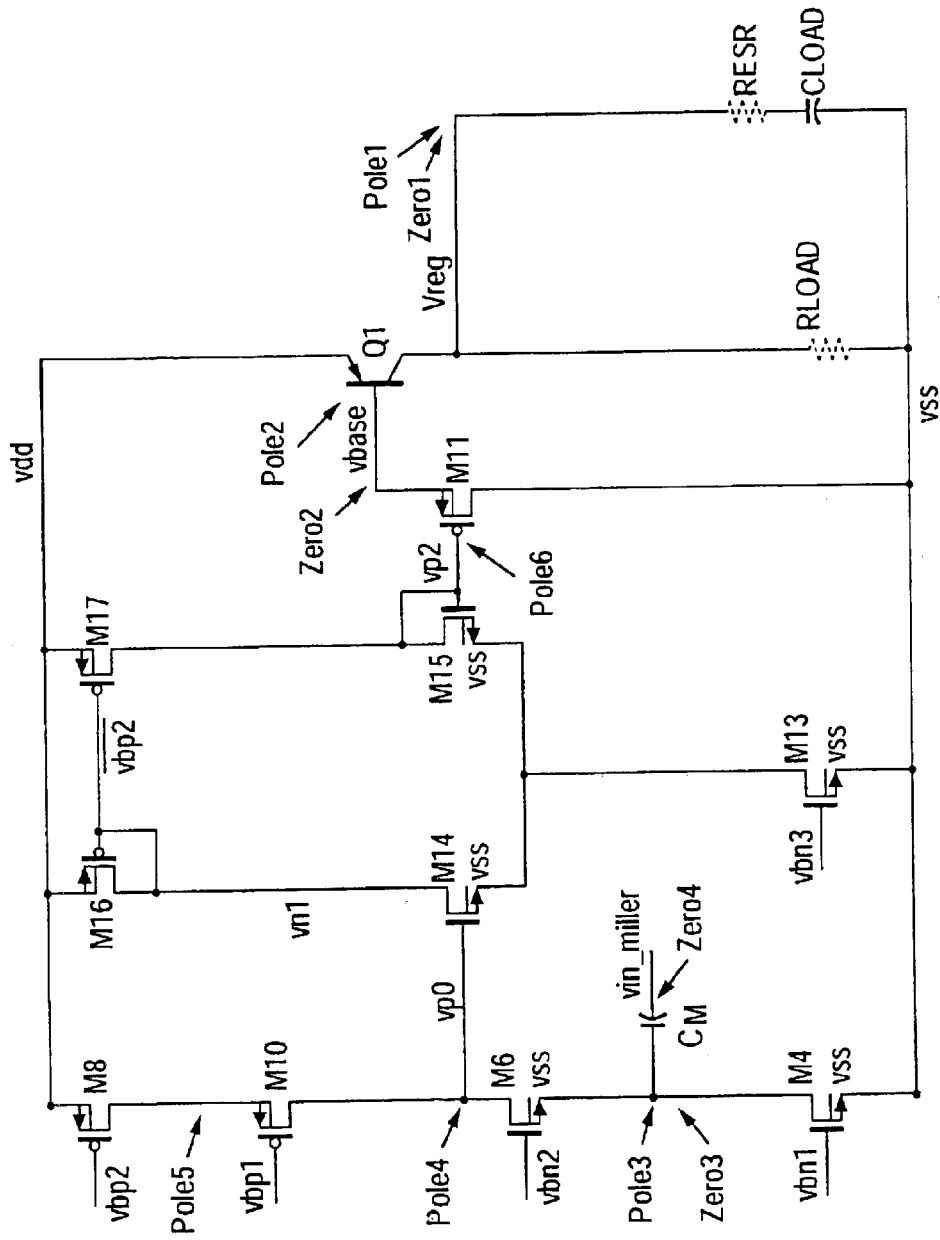
FIG. 7 is a schematic diagram of a portion of a low dropout voltage regulator system with a buffer amplifier introduced into the error amplifier to reduce internal loading effects.

Referring to FIG. 7, the Miller loop, as discussed above, is significantly loaded at the gate terminal of transistor M11, thereby negatively affecting the AC gain available at that node. A buffer amplifier (i.e., an amplifier having a high input impedance so as to minimize any loading effect upon the terminal from which it receives its input signal), e.g., in a form of a differential amplifier formed by N-MOSFETs M13, M14 and M15, and P-MOSFETs M16 and M17, can be inserted to reduce the loading at the gate terminal of transistor M11. This has the effect of raising the frequencies of poles 3 and 4, as well as the benefit of significantly increasing the gain to the drain terminal of transistor M6. Unfortunately, however, this also has the effect of introducing pole 6 associated with the gate terminal of transistor M11. Additionally, whereas pole 4 nearly cancelled zero 1 previously, pole 4 has now moved to a very high frequency, and with the gain now very high, the loop is no longer stable at high frequencies.

Figure 8:
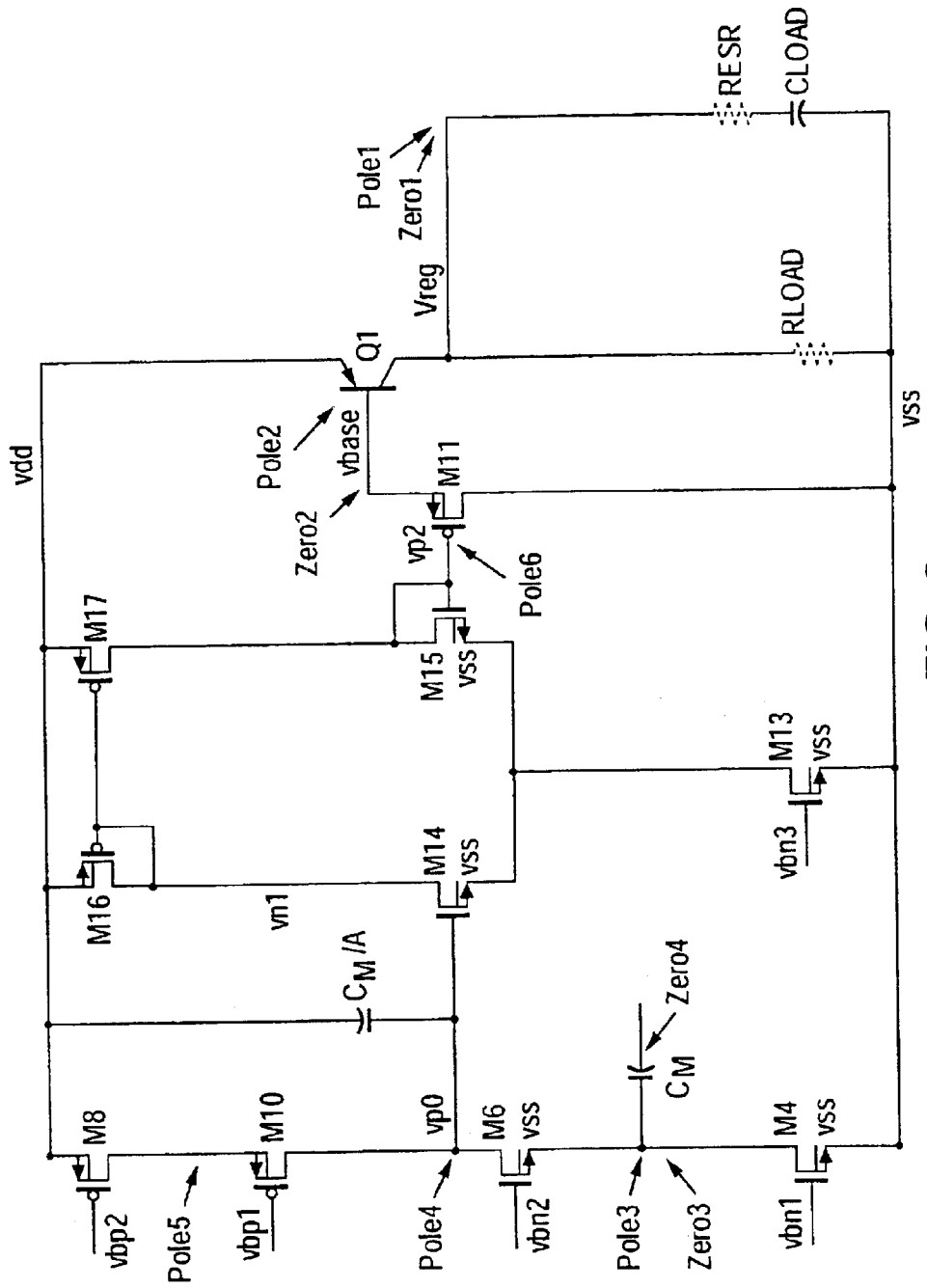
FIG. 8 is a schematic diagram of the circuit of FIG. 7 with a compensation capacitance introduced at the input to the buffer amplifier.

Referring to FIG. 8, adding a capacitance having a value Cm/A which is a fraction 1/A of the value Cm of the Miller feedback capacitance at the input terminal of the buffer amplifier (i.e., the gate terminal of the transistor M14) will compensate the system. Placing such compensation capacitance in this manner, i.e., capacitively coupling the gate terminal of transistor M14 to the positive power supply voltage VDD, avoids any degradation of the PSRR. As intended, the Miller-effect gain to the drain terminal of transistor M6 decreases and the system becomes stable. Additionally, the frequency of pole 4 decreases slightly.

Figure 9:
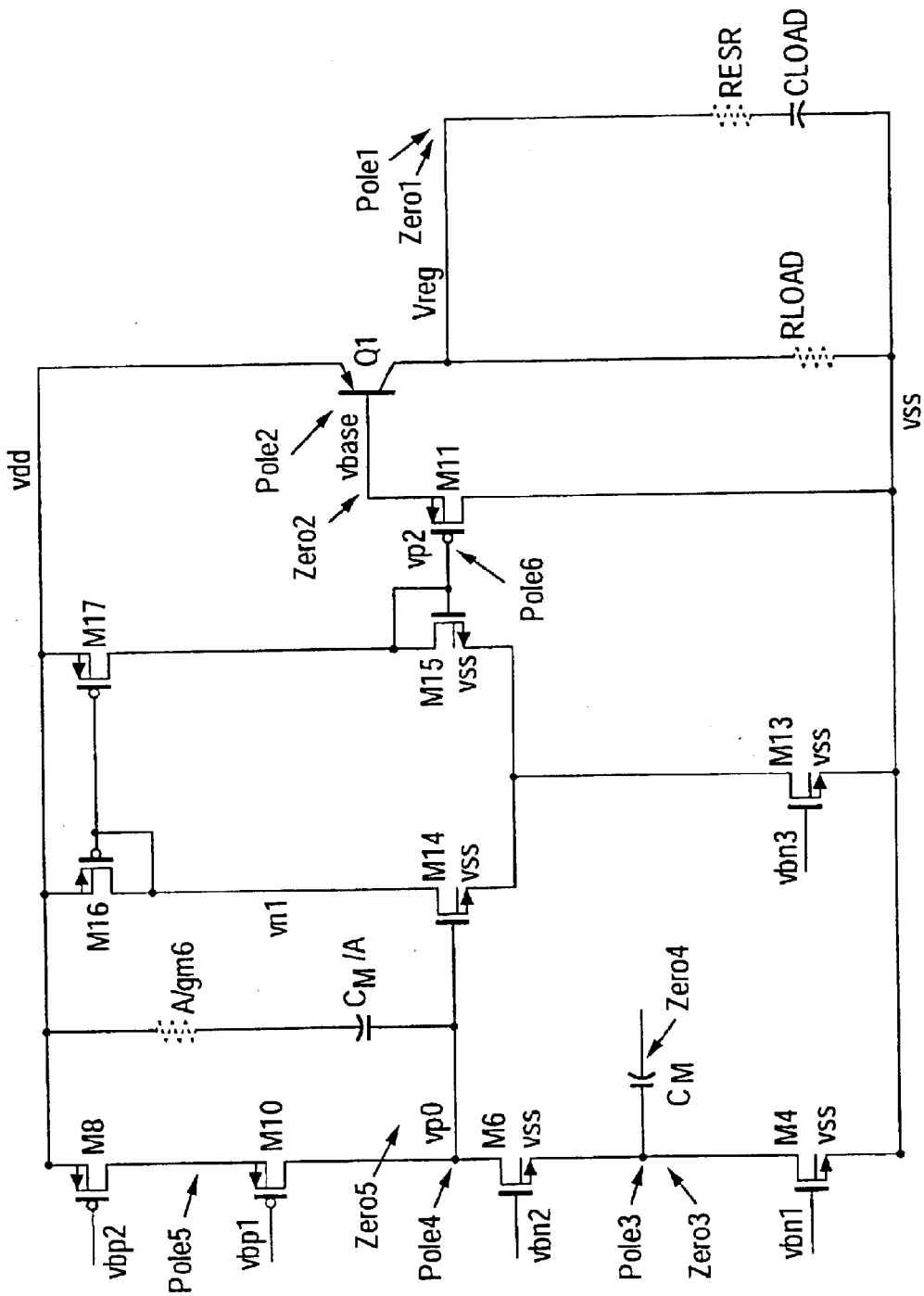
FIG. 9 is a schematic diagram of the circuit of FIG. 7 with a Miller-effect compensation network including capacitance and resistance introduced at the input of the buffer amplifier.

Referring to FIG. 9, it is now possible to cancel pole 4, i.e., introduce a zero having a frequency equal to the frequency of pole 4, by placing a resistor in series with the compensation capacitance. This resistance should have a value of the fractional factor A divided by the transconductance of transistor M6, or A/Gm6. This will have the effect of placing new zero 5 on top of pole 4, i.e., at equal frequencies. (A more detailed discussion of this compensation technique can be found in U.S. Pat. No. 6,580,325, entitled "Amplifier with Miller-Effect Frequency Compensation," the disclosure which is incorporated herein by reference.)

Figure 10:
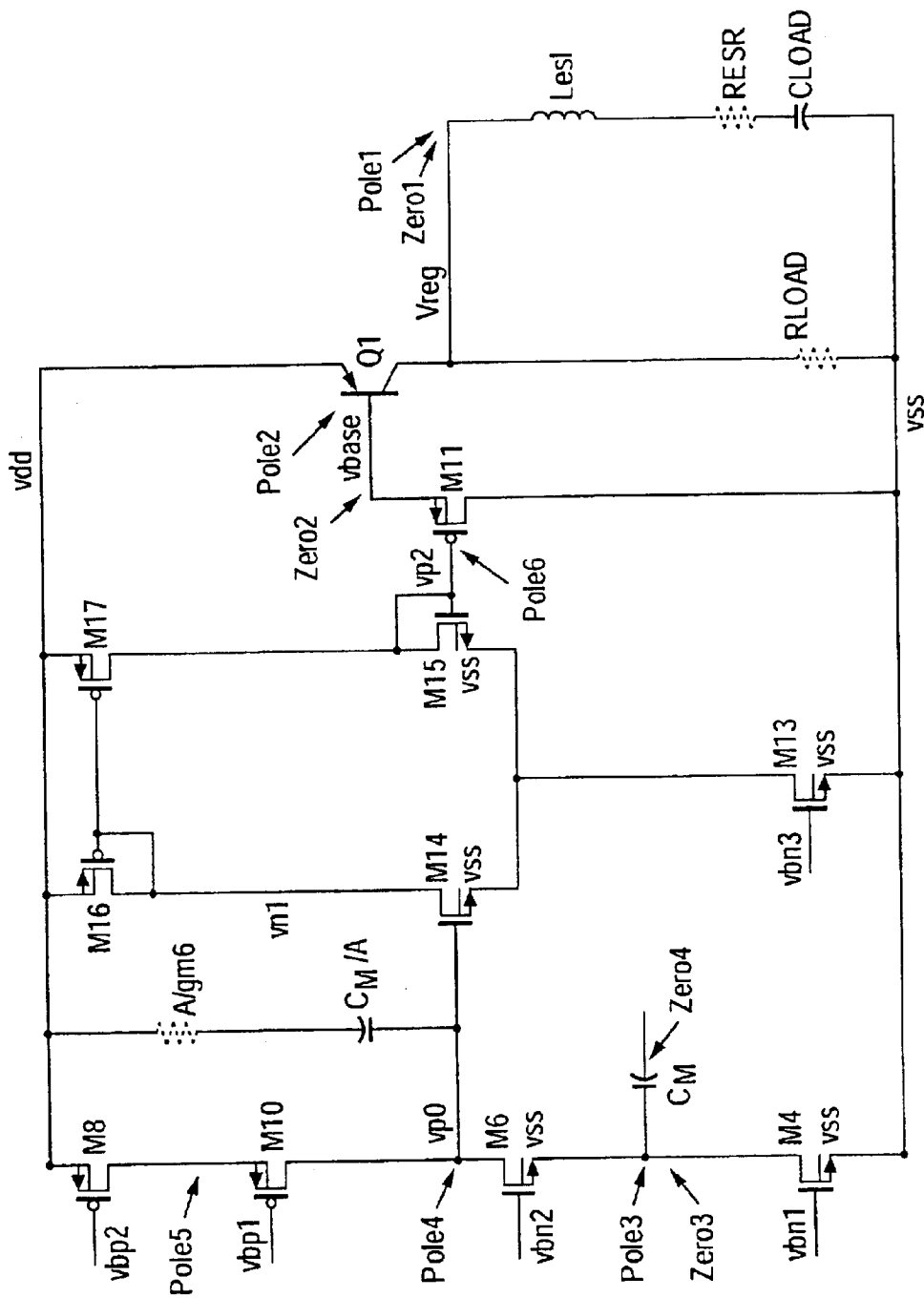
FIG. 10 is a schematic diagram of the circuit of FIG. 9 with the transfer function poles and zeros identified.

Referring to FIG. 10, as is well known in the art, the external load capacitor, in addition to its effective series resistance, also has an effective series inductance Lesl. This can pose a serious problem for the stability of the system. This effective series inductance generates an additional transfer function zero on top of a transfer function zero introduced by the effective series resistance Resr, thereby significantly expanding the bandwidth of the system and severely degrading the phase margin.

Figure 11:
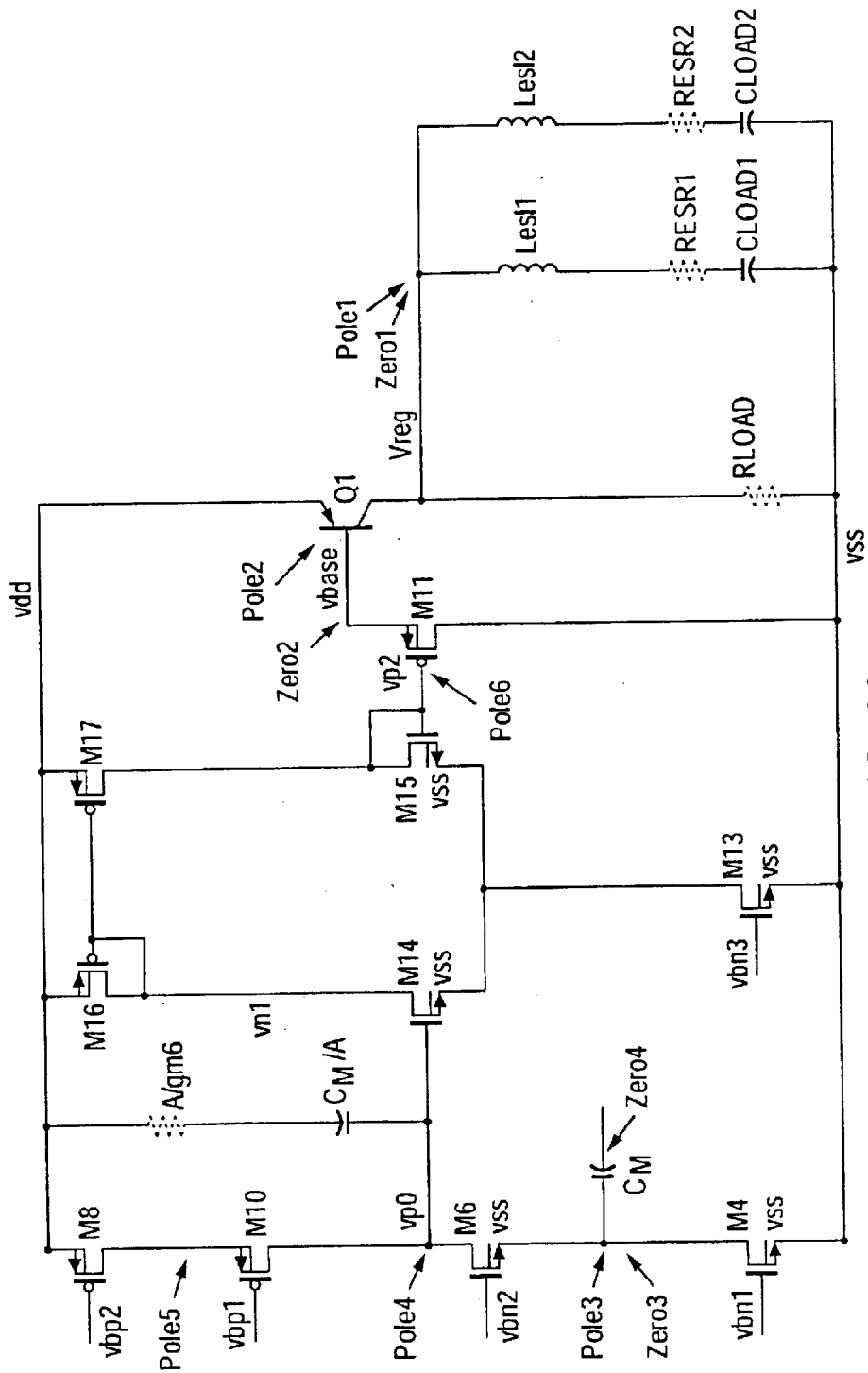
FIG. 11 is a schematic diagram of the circuit of FIG. 10 with an additional load bypass capacitance.

Referring to FIG. 11, one technique to dampen out this additional zero is to further bypass the load capacitor with an additional shunt capacitance. However, this does not eliminate the zero, but rather only adds a pair of closely-spaced complex poles that introduce a resonant notch into the magnitude and phase response characteristics. While this may slightly improve the phase margin, the response becomes unstable as it is on the edge of a very sharply changing phase response. While it is possible to introduce further dampening by adding additional bypass capacitance, significant transient instability can result.

Figure 12:
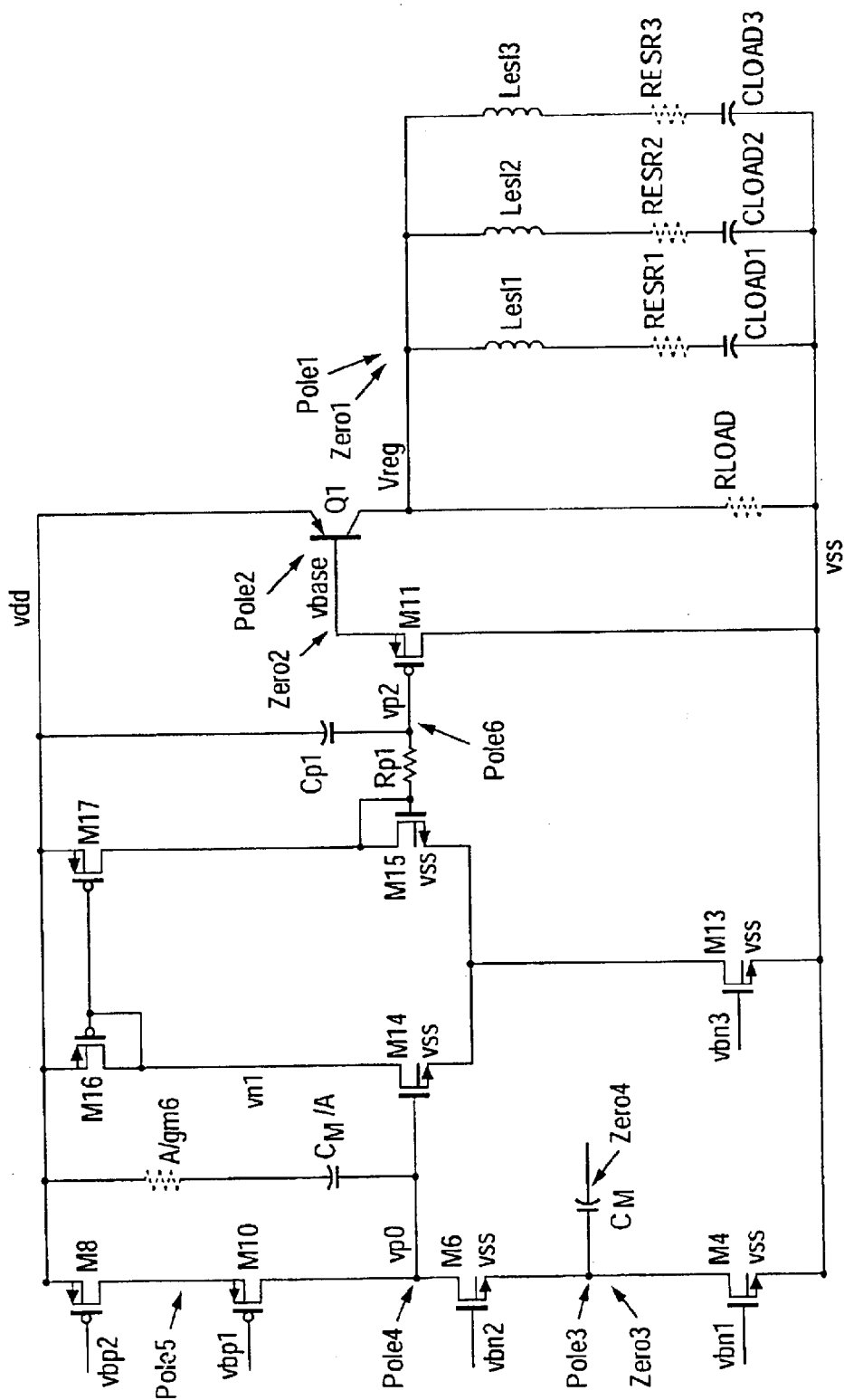
FIG. 12 is a schematic diagram of the circuit of FIG. 11 with an additional compensation network introduced at the output of the buffer amplifier.

Referring to FIG. 12, the primary high frequency problem is zero 1 caused by the effective series resistance of the main load capacitor. To eliminate zero 1, pole 6 can be adjusted by introducing a compensation network in the form of series resistance RP1 and shunt resistance CP1 at the input, or gate, terminal of transistor M11. These circuit elements can be made on-chip with reasonable accuracies (e.g., +/−20%).

Figure 13:
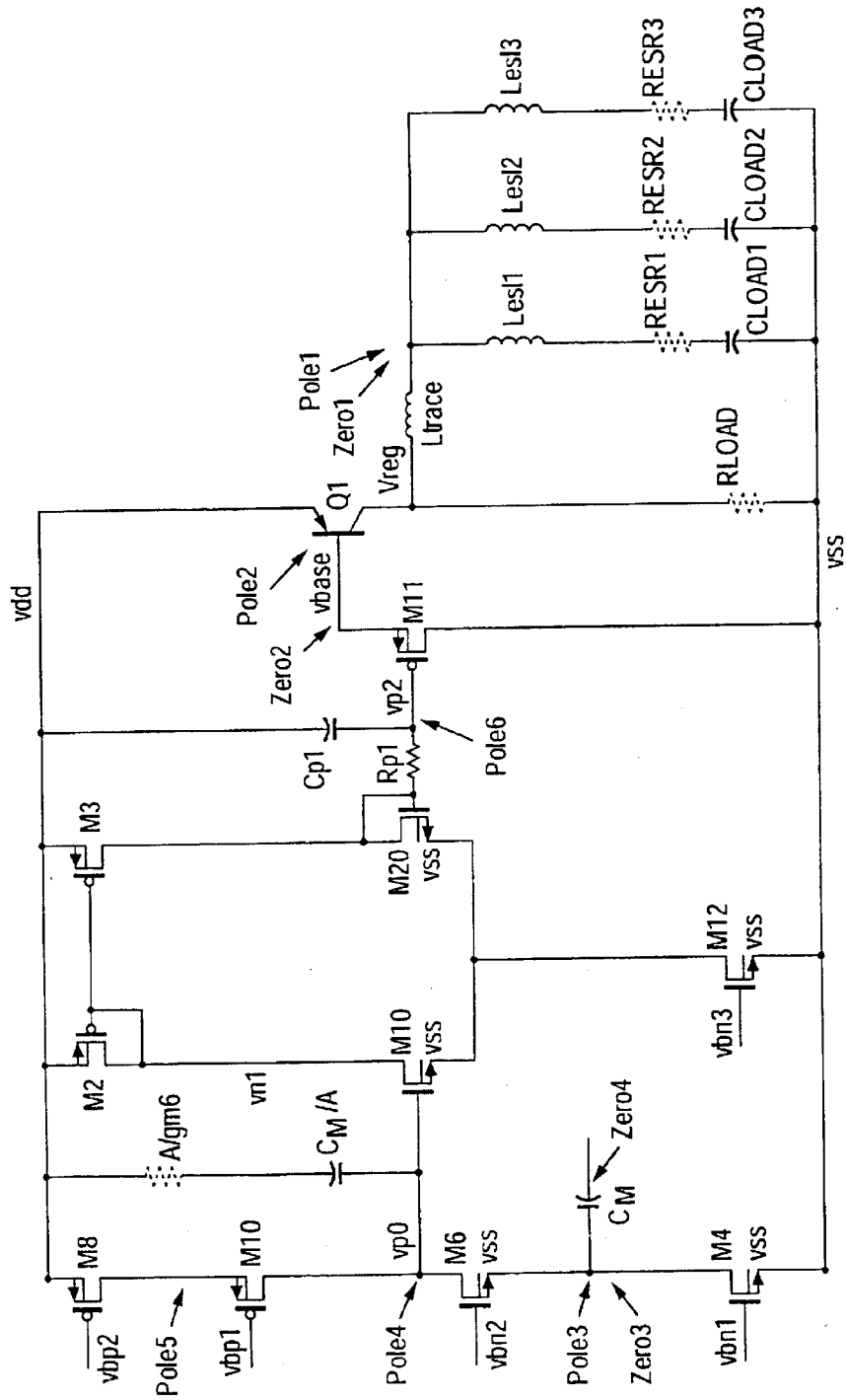
FIG. 13 is a schematic diagram of the circuit of FIG. 12 with the parasitic circuit board inductance identified.

Referring to FIG. 13, the external compensation, or filtering, capacitors will be separated by some finite distance from the integrated circuit containing the error amplifier. Accordingly, some amount of circuit board trace inductance Ltrace will exist. This can have a significant effect on the high frequency performance. Phase performance can be improved and a gain greater than unity in the closed loop response can be achieved.

Figure 14A:
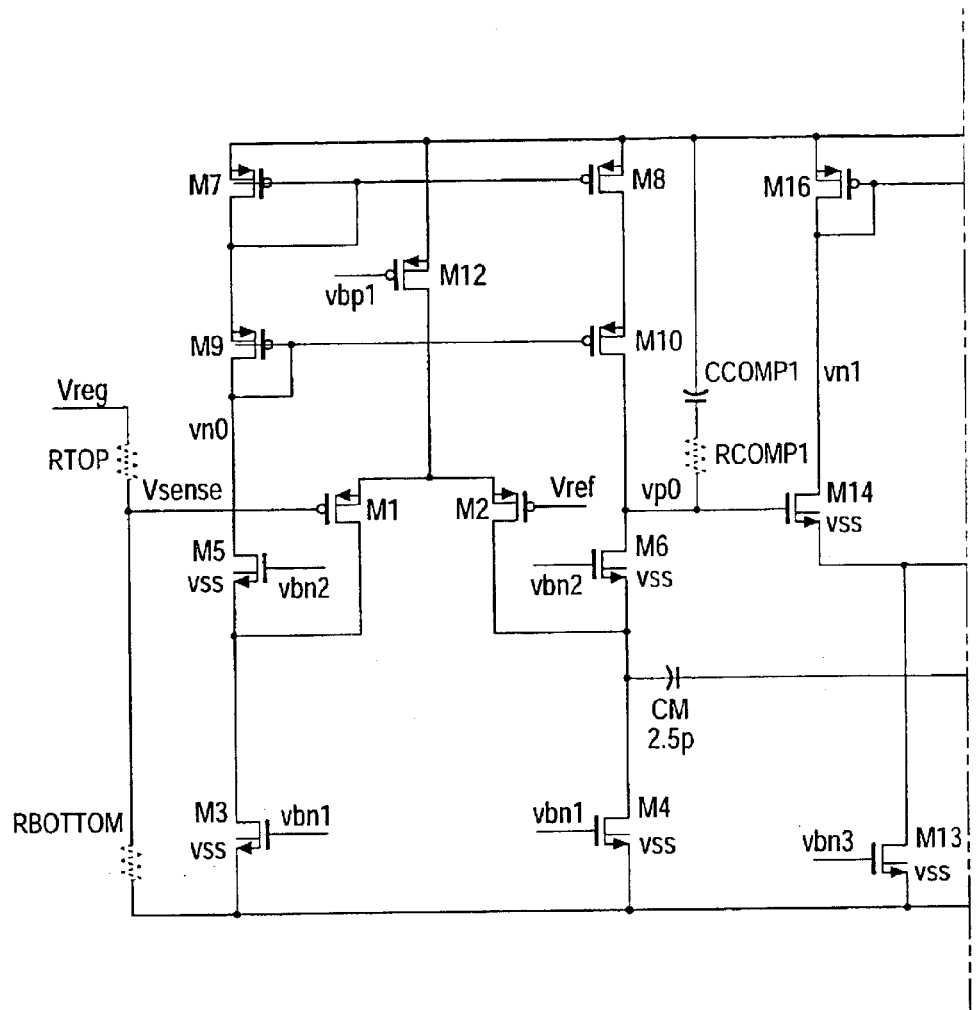
FIG. 14 is a schematic diagram of the full low dropout voltage regulator system with the buffer amplifier of FIG. 7 and compensation networks of FIGS. 9 and 12 included.
Figure 14A:
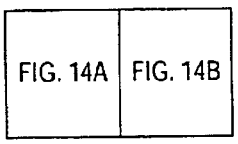
Figure 14B:
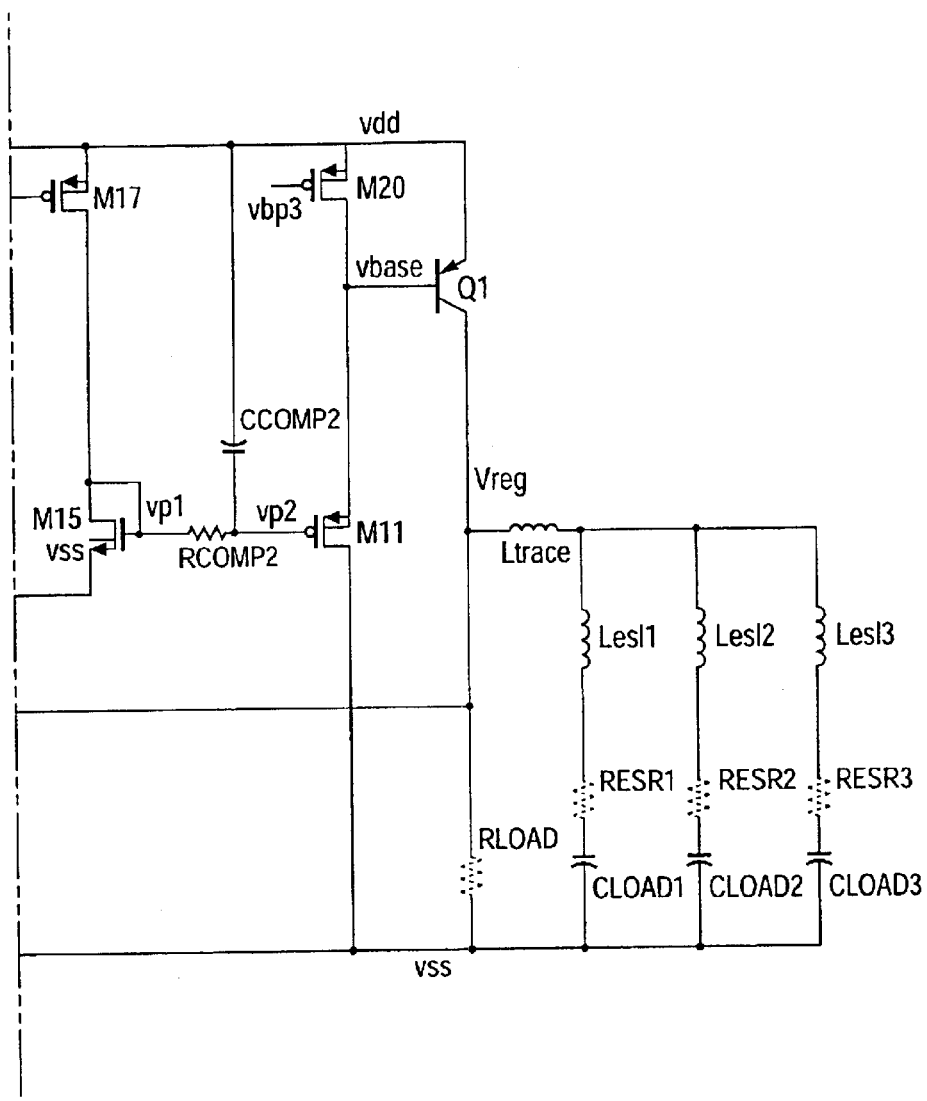

Referring to FIG. 14, the full circuit with all of the improvements as discussed above includes the internal buffer amplifier (transistors M13, M14, M15, M16 and M17) the Miller-effect compensation network (capacitor Ccomp1 and resistance Recomp1) and output compensation network (capacitance Ccomp2 and resistance Rcomp2). An additional NMOSFET (at a fixed bias Vbp3) M20 can be included for maintaining a small amount of current flow to transistor M11 under conditions of light loads (i.e., high values of Rload) and elevated operating temperatures.

Figure 15:
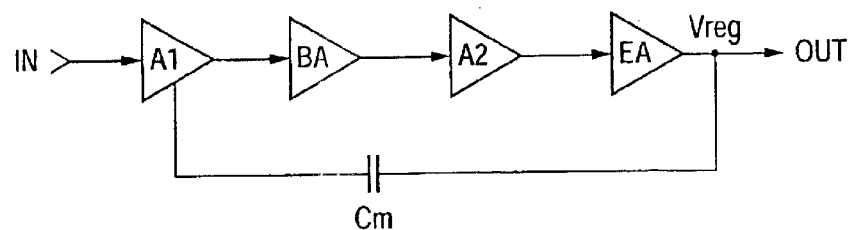
FIG. 15 is a functional block diagram of the circuit of FIG. 14 emphasizing one of the improvements realized in accordance with the presently claimed invention.
Figure 16:
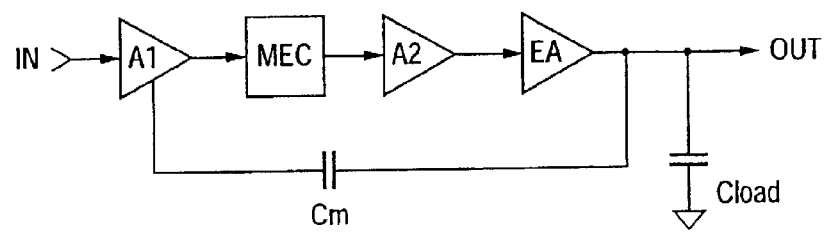
FIG. 16 is a functional block diagram of the circuit of FIG. 14 emphasizing another improvement realized in accordance with the presently claimed invention.
Figure 17:
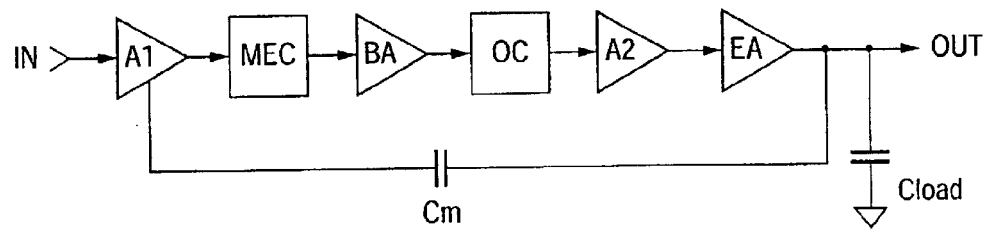
FIG. 17 is a function block diagram of the circuit of FIG. 14 emphasizing still another improvement realized in accordance with the presently claimed invention.

Referring to FIGS. 15, 16, and 17, the various improvements embodied in the circuitry of FIG. 14 are illustrated in a more emphasized manner. For example, in FIG. 15, the reduction in internal circuit loading afforded by the buffer amplifier is emphasized. The input application stage A1 has the internal low impedance circuit terminal to which the Miller-effect feedback capacitance CM is coupled from the output. The buffer amplifier BA buffers the signal from the amplifier stage A1 in such a manner as to not load the otherwise high impedance output terminal of this amplifier stage A1. The output of the buffer amplifier BA in turn, is further amplifier by the second, or output, amplifier stage A2 of the error amplifier. The output of this amplifier stage A2 drives the external amplification circuitry EA which provides the output to the load (not shown).

FIG. 16 emphasizes the presence of Miller-effect compensation within the error amplifier. As before, the input amplifier stage A1 receives the Miller-effect feedback through the feedback capacitance CM via its internal low impedance circuit terminal. Between this input stage A1 and the output amplifier stage A2, is the Miller-effect compensation network MEC. As before, the output of amplifier stage A2 drives the external amplification circuitry EA.

FIG. 17 emphasizes the overall system in which all of the foregoing elements are included: the internal buffer amplifier BA; the Miller-effect compensation network MEC; and the output compensation network OC which compensates for the output zero, as discussed above.

In conformance with the foregoing discussion, while the various embodiments of the presently claimed invention as disclosed depict the input amplifier stage (transistors M1, M2, M3, M5, M6, M7, M8, M9, M10 and M12) as being differential, it should be understood that the presently claimed invention does not require that the input amplification circuitry be differential. Rather, such differential circuitry as disclosed merely constitutes a preferred embodiment. The presently claimed invention can also be implemented using single-ended input amplification circuitry, many forms and implementations of which are well known in the art. Further, more amplification stages can be included inside the Miller feedback loop. As discussed above, what is important is that the Miller capacitance be fed back to a low impedance node.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated circuit with a buffer amplifier inside a Miller-effect feedback loop for reducing loading on an internal high impedance circuit terminal, comprising:

first amplification circuitry including an internal terminal and a first amplifier output terminal, wherein
said internal terminal has an internal terminal impedance associated therewith,
said first amplifier output terminal has a first amplifier output terminal impedance associated therewith,
said internal terminal impedance is substantially lower than said first amplifier output terminal impedance, and
said first amplification circuitry is adapted to couple via said internal terminal to a Miller-effect feedback capacitance;

buffer amplification circuitry including buffer input and output terminals, wherein said buffer input terminal is coupled to said first amplifier output terminal; and second amplification circuitry including a second amplifier input terminal coupled to said buffer output terminal, wherein
said second amplifier input terminal has a second amplifier input terminal impedance associated therewith,
said second amplifier input terminal impedance is substantially lower than said first amplifier output terminal impedance, and
said second amplification circuitry is adapted to couple to further amplification circuitry that includes said Miller-effect feedback capacitance.

2. The apparatus of claim 1, wherein said first amplification circuitry comprises differential amplifier circuitry.

3. The apparatus of claim 1, wherein said buffer amplification circuitry comprises differential amplifier circuitry.

4. The apparatus of claim 1, wherein said second amplification circuitry comprises a field effect transistor amplifier in a source follower configuration.

5. An apparatus including an integrated circuit with a buffer amplifier inside a Miller-effect feedback loop for reducing loading on an internal high impedance circuit node, comprising:

first amplifier means for receiving via an internal node a feedback signal via a Miller-effect feedback capacitance and providing via a first amplifier output node a first amplified signal, wherein
said internal node has an internal node impedance associated therewith,
said first amplifier output node has a first amplifier output node impedance associated therewith, and
said internal node impedance is substantially lower than said first amplifier output node impedance;

buffer amplifier means for receiving and buffering said first amplified signal and providing a buffered signal; and second amplifier means for receiving via a second amplifier input node and amplifying said buffered signal and providing a second amplified signal for further amplifier means including said Miller-effect feedback capacitance, wherein
said second amplifier input node has a second amplifier input node impedance associated therewith, and
said second amplifier input node impedance is substantially lower than said first amplifier output node impedance.

6. An apparatus including an integrated circuit with a compensation circuit inside a Miller-effect feedback loop, comprising:
first amplification circuitry including an internal terminal and a first amplifier output terminal, wherein
said first amplifier output terminal has a first amplifier output terminal impedance associated therewith, and
said first amplification circuitry is adapted to couple via said internal terminal to a Miller-effect feedback capacitance;
second amplification circuitry including a second amplifier input terminal having a second amplifier input terminal impedance associated therewith, wherein
said second amplifier input terminal impedance is substantially lower than said first amplifier output terminal impedance, and
said second amplification circuitry is adapted to couple to further amplification circuitry that includes said Miller-effect feedback capacitance and a shunt capacitance having an effective series resistance associated therewith; and
compensation circuitry coupled between said first amplification circuitry and said second amplification circuitry;
wherein
said first amplification circuitry, said compensation circuitry and said second amplification circuitry together, when coupled to said further amplification circuitry, have a circuit transfer function associated therewith that includes a transfer function zero associated with at least a portion of said further amplification circuitry and a transfer function pole associated with said compensation circuitry, and
said transfer function zero and pole are at substantially equal frequencies.

7. The apparatus of claim 6, wherein said first amplification circuitry comprises differential amplifier circuitry.

8. The apparatus of claim 6, wherein said second amplification circuitry comprises differential amplifier circuitry.

9. The apparatus of claim 6, wherein said compensation circuitry comprises a series circuit element and a shunt circuit element.

10. The apparatus of claim 9, wherein:
said series circuit element comprises a resistance; and
said shunt circuit element comprises a capacitance.

11. An apparatus including an integrated circuit with a compensation circuit inside a Miller-effect feedback loop, comprising:
first amplifier means for receiving via an internal node a feedback signal via a Miller-effect feedback capacitance and providing via a first amplifier output node a first amplified signal, wherein said first amplifier output node has a first amplifier output node impedance associated therewith;
compensation means for compensating said first amplified signal and providing a compensated signal; and
second amplifier means for receiving via a second amplifier input node and amplifying said compensated signal and providing a second amplified signal for further amplifier means including said Miller-effect feedback capacitance and a shunt capacitance having an effective series resistance associated therewith, wherein
said second amplifier input node has a second amplifier input node impedance associated therewith, and
said second amplifier input node impedance is substantially lower than said first amplifier output node impedance;
wherein
said first amplifier means, said compensation means and said second amplifier means together, when coupled to said further amplifier means, have a transfer function associated therewith that includes a transfer function zero associated with at least a portion of said further amplifier means and a transfer function pole associated with said compensation means, and
said transfer function zero and pole are at substantially equal frequencies.

12. An apparatus including an integrated circuit with a plurality of compensation circuits inside a Miller-effect feedback loop, comprising:
input amplification circuitry including an internal terminal and an input amplifier output terminal, wherein
said input amplifier output terminal has an input amplifier output terminal impedance associated therewith, and
said input amplification circuitry is adapted to couple via said internal terminal to a Miller-effect feedback capacitance;
buffer amplification circuitry including a buffer input terminal coupled to said input amplifier output terminal;
Miller-effect compensation circuitry coupled between said input amplification circuitry and said buffer amplification circuitry;
output amplification circuitry including an output amplifier input terminal and adapted to couple to further amplification circuitry that includes said Miller-effect feedback capacitance and a shunt capacitance having an effective series resistance associated therewith; and
output compensation circuitry coupled between said buffer and output amplification circuitry;
wherein
said input amplification circuitry, said Miller-effect compensation circuitry, said buffer amplification circuitry, said output compensation circuitry, and said output amplification circuitry together, when coupled to said further amplification circuitry, have a circuit transfer function associated therewith that includes a first transfer function zero associated with said Miller-effect compensation circuitry, a second transfer function zero associated with at least a portion of said further amplification circuitry, a first transfer function pole associated with said Miller-effect feedback capacitance and a second transfer function pole associated with said output compensation circuitry,
said first transfer function zero and pole are at first substantially equal frequencies, and
said second transfer function zero and pole are at second substantially equal frequencies.

13. The apparatus of claim 12, wherein said input amplification circuitry comprises differential amplifier circuitry.

14. The apparatus of claim 12, wherein said buffer amplification circuitry comprises differential amplifier circuitry.

15. The apparatus of claim 12, wherein said Miller-effect compensation circuitry comprises a plurality of serially coupled circuit elements coupled in shunt between said input amplification circuitry and said buffer amplification circuitry.

16. The apparatus of claim 15, wherein said plurality of serially coupled circuit elements comprises a resistance and a capacitance.

17. The apparatus of claim 12, wherein said output amplification circuitry comprises a field effect transistor amplifier in a source follower configuration.

18. The apparatus of claim 12, wherein said output compensation circuitry comprises a series circuit element and a shunt circuit element.

19. The apparatus of claim 18, wherein:

said series circuit element comprises a resistance; and said shunt circuit element comprises a capacitance.

20. An apparatus including an integrated circuit with a plurality of compensation circuits inside a Miller-effect feedback loop, comprising:

input amplifier means for receiving via an internal node a feedback signal via a Miller-effect feedback capacitance and providing via an input amplifier output node a first amplified signal, wherein said input amplifier output node has an input amplifier output node impedance associated therewith;

Miller-effect compensation means for compensating said first amplified signal and providing a first compensated signal;

buffer amplifier means for receiving and buffering said first compensated signal and providing a buffered signal;

output compensation means for compensating said buffered signal and providing a second compensated signal; and output amplifier means for receiving via an output amplifier input node and amplifying said second compensated signal and providing a second amplified signal for further amplifier means including said Miller-effect feedback capacitance and a shunt capacitance having an effective series resistance associated therewith; and wherein said input amplifier means, said Miller-effect compensation means, said buffer amplifier means, said output compensation means and said output amplifier means together, when coupled to said further amplifier means, have a transfer function associated therewith that includes a first transfer function zero associated with said Miller-effect compensation means, a second transfer function zero associated with at least a portion of said further amplifier means, a first transfer function pole associated with said Miller-effect feedback capacitance and a second transfer function pole associated with said output compensation means, said first transfer function zero and pole are at first substantially equal frequencies, and said second transfer function zero and pole are at second substantially equal frequencies.

* * * * *

UNITED STATES PATENT AND TRADEMARK OFFICE
CERTIFICATE OF CORRECTION

PATENT NO.     : 6,822,514 B1
DATED          : November 23, 2004
INVENTOR(S)    : Arlo Aude It is certified that error appears in the above-identified patent and that said Letters Patent is hereby corrected as shown below:

<u>Column 9,</u>
Line 15, delete "Recomp1" and replace with -- Rcomp1 --.

Signed and Sealed this

Fifth Day of April, 2005

JON W. DUDAS
*Director of the United States Patent and Trademark Office*